United States Patent
Cherng et al.

(10) Patent No.: US 11,763,715 B2
(45) Date of Patent: Sep. 19, 2023

(54) ELECTRONIC DEVICE AND SCAN DRIVING CIRCUIT

(71) Applicant: Innolux Corporation, Miao-Li County (TW)

(72) Inventors: Yi-Shiuan Cherng, Miao-Li County (TW); Chia-Hao Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 105 days.

(21) Appl. No.: 17/499,830

(22) Filed: Oct. 12, 2021

(65) Prior Publication Data

US 2022/0148482 A1 May 12, 2022

(30) Foreign Application Priority Data

Nov. 10, 2020 (CN) .......................... 202011248408.2

(51) Int. Cl.
  *G09G 3/20* (2006.01)
  *H03K 3/037* (2006.01)
  *G11C 19/00* (2006.01)

(52) U.S. Cl.
  CPC ............... *G09G 3/20* (2013.01); *H03K 3/037* (2013.01); *G09G 2300/0809* (2013.01); *G09G 2310/0267* (2013.01); *G09G 2310/0286* (2013.01); *G09G 2310/0291* (2013.01); *G09G 2310/0297* (2013.01); *G09G 2310/08* (2013.01); *G11C 19/00* (2013.01)

(58) Field of Classification Search
  None
  See application file for complete search history.

(56) References Cited

U.S. PATENT DOCUMENTS

| | | | | |
|---|---|---|---|---|
| 5,956,008 A * | 9/1999 | Kawasaki | ............ | G09G 3/3688 345/100 |
| 6,040,812 A * | 3/2000 | Lewis | .................. | G09G 3/2033 345/691 |
| 7,956,829 B2 * | 6/2011 | Iida | ........................ | G09G 3/3233 345/82 |
| 2004/0041769 A1 * | 3/2004 | Yamashita | ........... | G09G 3/3677 345/93 |
| 2006/0007768 A1 * | 1/2006 | Kim | ..................... | G09G 3/3291 365/205 |
| 2008/0165112 A1 * | 7/2008 | Su | ......................... | G09G 3/3677 345/98 |
| 2009/0021662 A1 * | 1/2009 | Chang | .................... | G02F 1/1368 349/46 |
| 2009/0033641 A1 * | 2/2009 | Yamazaki | ............ | G09G 3/3674 345/204 |

(Continued)

FOREIGN PATENT DOCUMENTS

CN 102354066 5/2015

*Primary Examiner* — Patrick N Edouard
*Assistant Examiner* — Peijie Shen
(74) *Attorney, Agent, or Firm* — JCIPRNET

(57) ABSTRACT

An electronic device and a scan driving circuit each including a shift register and a demultiplexer are provided. The demultiplexer is electrically connected to the shift register. The demultiplexer includes at least one scan unit. The at least one scan unit includes a switch circuit and a buffer. An input terminal of the buffer is electrically connected to the switch circuit. An output terminal of the buffer is electrically connected to a scan line.

16 Claims, 9 Drawing Sheets

(56) References Cited

U.S. PATENT DOCUMENTS

| | | | |
|---|---|---|---|
| 2009/0079715 A1* | 3/2009 | Kim | G09G 3/3677 326/88 |
| 2011/0273408 A1* | 11/2011 | Ra | G09G 3/3266 345/204 |
| 2013/0215158 A1* | 8/2013 | Fujita | G09G 3/3291 345/77 |
| 2013/0328612 A1* | 12/2013 | Ofuji | G11C 19/28 327/408 |
| 2014/0232626 A1* | 8/2014 | Jamshidi-Roudbari | G09G 3/3688 345/99 |
| 2015/0170568 A1* | 6/2015 | Lee | G11C 19/287 345/77 |
| 2015/0235590 A1* | 8/2015 | Peng | G11C 19/28 327/109 |
| 2016/0005359 A1* | 1/2016 | Kwon | G09G 3/3266 345/82 |
| 2017/0061855 A1* | 3/2017 | Tsai | G09G 3/2092 |
| 2017/0140723 A1* | 5/2017 | Zhao | G09G 3/3648 |
| 2018/0293943 A1* | 10/2018 | Hong | G09G 3/3674 |
| 2019/0043405 A1* | 2/2019 | Noh | G09G 3/20 |
| 2019/0130848 A1* | 5/2019 | Kim | G09G 3/3266 |
| 2019/0180671 A1* | 6/2019 | Cheng | G09G 3/3266 |
| 2020/0035137 A1* | 1/2020 | Chen | G11C 19/28 |
| 2020/0160793 A1* | 5/2020 | Cherng | G09G 3/3688 |
| 2020/0194089 A1* | 6/2020 | Xu | G09G 3/3648 |
| 2021/0225257 A1* | 7/2021 | Tsai | G09G 3/2092 |
| 2021/0287615 A1* | 9/2021 | Cherng | G09G 3/3688 |
| 2022/0093032 A1* | 3/2022 | Lin | G06V 40/1318 |

* cited by examiner

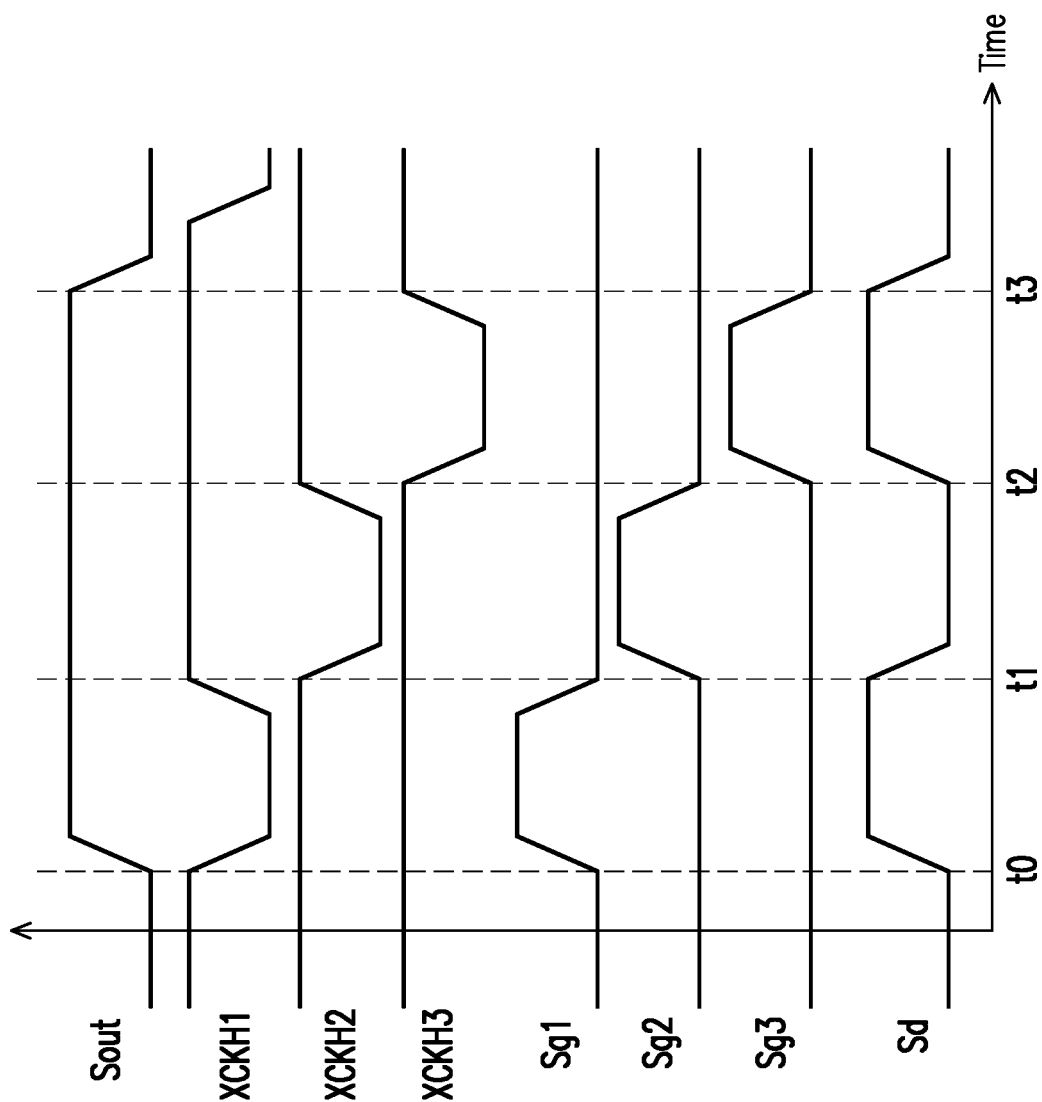

US 11,763,715 B2

ELECTRONIC DEVICE AND SCAN DRIVING CIRCUIT

CROSS-REFERENCE TO RELATED APPLICATION

This application claims the priority benefit of Chinese application no. 202011248408.2, filed on Nov. 10, 2020. The entirety of the above-mentioned patent application is hereby incorporated by reference herein and made a part of this specification.

BACKGROUND

Technical Field

The disclosure relates to a device and a circuit, and in particular, to an electronic device and a scan driving circuit.

Description of Related Art

As requirements for image quality by users continuously increase, frequencies of signals for driving pixel circuits in a display panel continuously increase to meet the requirements for image quality. However, in the existing data driving circuit design, especially in a case where the display panel is operated in a high-frequency drive mode, since charging time of pixels is reduced, pixels of the display panel are thus prone to charge failures, thereby affecting the image quality.

SUMMARY

The disclosure provides an electronic device and a scan driving circuit, capable of effectively driving a pixel array in a panel.

The disclosure is directed to an electronic device. The electronic device includes a shift register and a demultiplexer. The demultiplexer is electrically connected to the shift register. The demultiplexer includes at least one scan unit. The at least one scan unit includes a switch circuit and a buffer. An input terminal of the buffer is electrically connected to the switch circuit. An output terminal of the buffer is electrically connected to a scan line.

The disclosure is directed to a scan driving circuit. The scan driving circuit includes a shift register and a demultiplexer. The demultiplexer is electrically connected to the shift register. The demultiplexer includes at least one scan unit. The at least one scan unit includes a switch circuit and a buffer. An input terminal of the buffer is electrically connected to the switch circuit. An output terminal of the buffer is electrically connected to a scan line.

Based on the above, with the electronic device and the scan driving circuit of the disclosure, the panel can provide good image quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2B is a schematic diagram of signal waveforms according to some embodiments of the disclosure.

DESCRIPTION OF THE EMBODIMENTS

Figure 1:
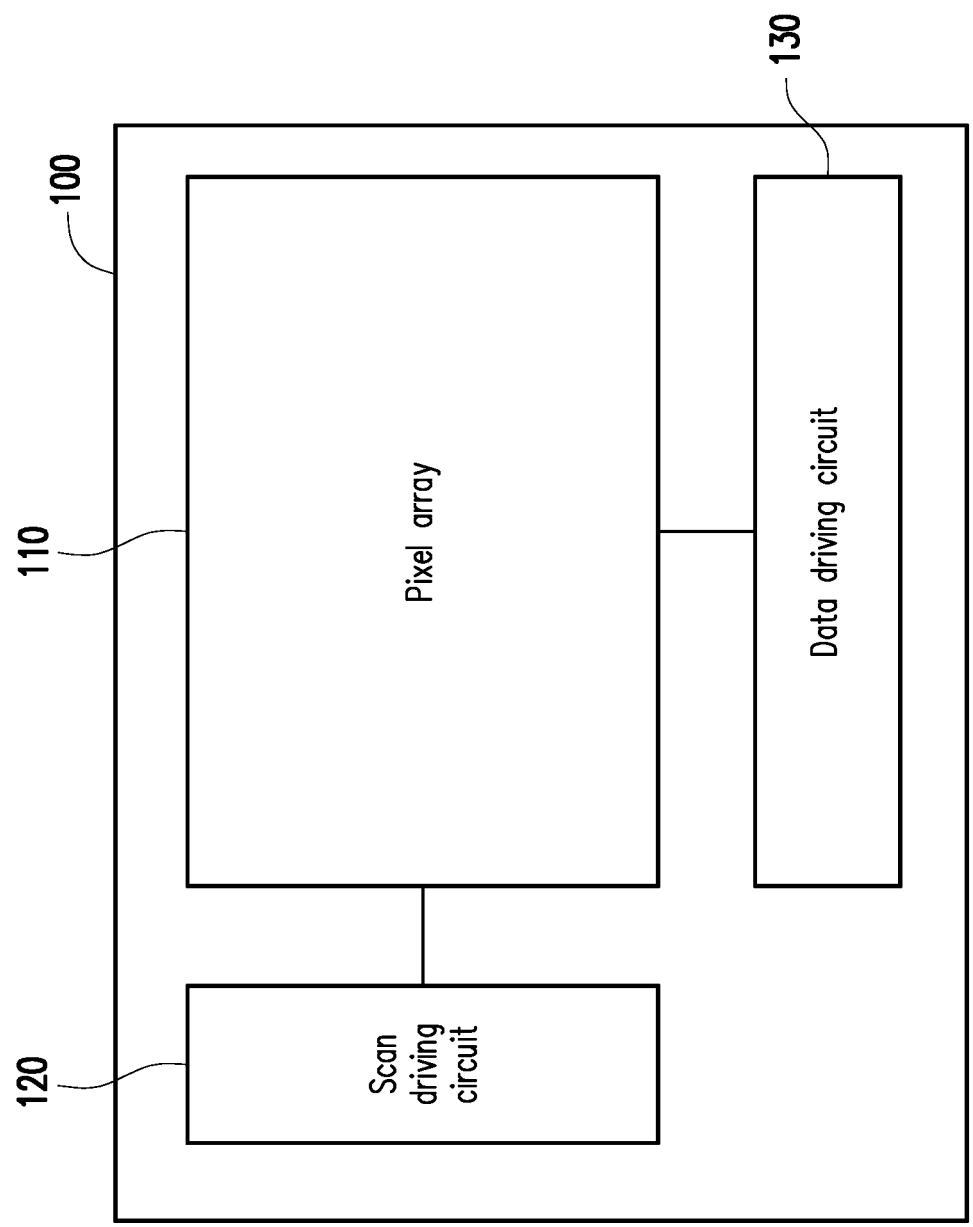
FIG. 1 is a schematic diagram of an electronic device according to some embodiments of the disclosure.

Reference will now be made in detail to the exemplary embodiments of the disclosure, examples of which are described in the accompanying drawings. Wherever possible, the same reference numerals are used in the drawings and the description to refer to the same or similar parts.

Throughout the description of the disclosure and the appended claims, certain terms are used to refer to specific components. Those skilled in the art should understand that electronic device manufacturers may refer to the same components by different names. It is not intended herein to distinguish between components that have the same function but different names. In the following description and claims, the terms "comprise" and "include" are open-ended terms, so they should be interpreted to mean "comprise but not limited to . . . ".

In some embodiments of the disclosure, unless specifically defined, terms related to bonding and connection such as "connect", "interconnect", and so on may mean that two structures are in direct contact, or that two structures are not in direct contact with another structure provided in between. In addition, the terms related to bonding and connection may also cover cases where two structures are both movable or two structures are both fixed. Moreover, the term "electrically connect" includes any direct and indirect electrical connection means.

In the specification and claims, the use of an ordinal number such as "first", "second", and so on to modify a component does not by itself connote or represent any priority, precedence, or order of one component over another, or the order in which a manufacturing method is performed, but only to clearly distinguish a component having a certain name from another component having the same name (but for use of the ordinal number). The same terms may be not used in the claims as used in the specification, and accordingly a first member in the specification may be a second member in the claims.

In the disclosure, the electronic device may include, but is not limited to, a display device, an antenna device, a sensing device, a touch display, a curved display, or a free shape display. The electronic device may be a bendable or flexible electronic device. The electronic device may include, for example but not limited to, a panel of liquid crystals, light-emitting diodes, quantum dots (QD), fluorescence, phosphor, other suitable display media, or a combination of the above materials. The light-emitting diode may include, for example but not limited to, an organic light-emitting diode (OLED), a mini LED, a micro LED, a quantum dot light-emitting diode (QLED or QDLED), or other suitable materials, and the materials thereof can be arranged and combined arbitrarily. The display device may include, for example but is not limited to, a splicing display device. The antenna device may be, for example but not limited to, a liquid crystal antenna. The antenna device may include, for example but not limited to, an antenna splicing device. It should be noted that the electronic device may be arbitrary arrangement and combination of the above, but is not limited thereto. In addition, the electronic device in appearance may have a rectangular shape, a circular shape, a polygonal shape, a shape having curved edges, or other suitable shapes. The electronic device may have peripheral systems such as a driving system, a control system, a light source system, a shelf system, etc., to support the display device, the antenna device, or the splicing device. A display device will be adopted for describing the disclosure below. Nonetheless, the disclosure is not limited thereto.

It should be noted that technical features in different embodiments described below can be replaced, recombined, or mixed with one another to constitute another embodiment without departing from the spirit of the disclosure. The features in various embodiments can be arbitrarily mixed and combined for use without departing from or conflicting with the spirit of the disclosure.

FIG. 1 is a schematic diagram of an electronic device according to some embodiments of the disclosure. With reference to FIG. 1, an electronic device 100 may be a panel, but the disclosure is not limited thereto. The electronic device 100 includes a pixel array 110, a scan driving circuit 120, and a data driving circuit 130. The scan driving circuit 120 is electrically connected to the pixel array 110 through a plurality of scan lines, and is configured to output scan signals to a plurality of sub-pixels in the pixel array 110. The data driving circuit 130 is electrically connected to the pixel array 110 through a plurality of data lines, and is configured to output data signals to the sub-pixels in the pixel array 110. In this embodiment, the pixel array 110 may be formed by, for example, a tri-gate full-screen driving circuit (One Data Triple Gate (ODTG)) architecture, but the disclosure is not limited thereto. In this embodiment, the pixel array 110 may correspond to an active area (AA) of the panel, and the scan driving circuit 120 and the data driving circuit 130 may be formed in a peripheral area of the panel. The scan driving circuit 120 may be formed, for example, in the peripheral area of the panel on at least one of the left side and the right side of the pixel array 110, and the data driving circuit 130 may be formed, for example, in the peripheral area of the panel on the lower side of the pixel array 110. Nonetheless, the positions of the pixel array 110, the scan driving circuit 120, and the data driving circuit 130 on the electronic device 100 or the panel are not limited by the disclosure. The positions of the pixel array 110, the scan driving circuit 120, and the data driving circuit 130 on the electronic device 100 or the panel may be correspondingly designed according to the type of the electronic device 100, the type of the panel, or the shape of the panel.

Figure 2A:
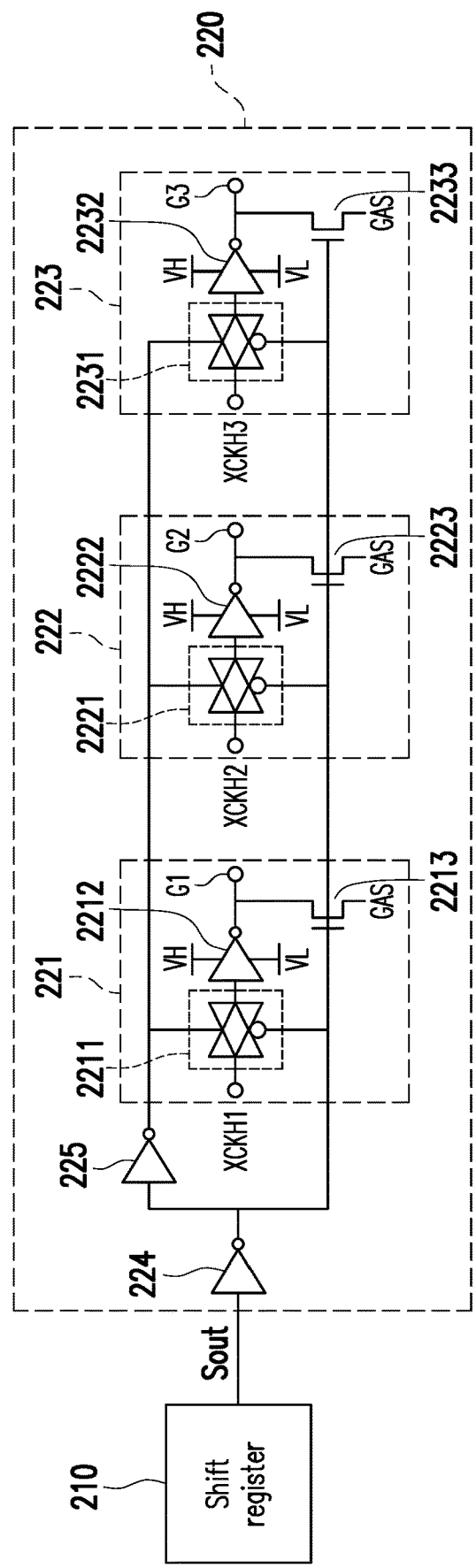
FIG. 2A is a schematic diagram of a scan driving circuit according to some embodiments of the disclosure.

FIG. 2A is a schematic diagram of a scan driving circuit according to some embodiments of the disclosure. With reference to FIG. 1 and FIG. 2A, the scan driving circuit 120 in the embodiment of FIG. 1 may include one or more switching circuits, and the one or more switching circuits may be configured to drive the plurality of pixels in the pixel array 110. In this embodiment, each of the one or more switching circuits may include a shift register (SR) 210 and a demultiplexer (DEMUX) 220 as shown in FIG. 2A. In this embodiment, the demultiplexer 220 is electrically connected to the shift register 210. The demultiplexer 220 includes scan units 221 to 223, an inverter 224, and an inverter 225. The scan units 221 to 223 are electrically connected to respectively scan lines G1 to G3 of the pixel array 110. The scan lines G1 to G3 may respectively correspond to three sub-pixel rows, and the three sub-pixel rows respectively include, for example, a plurality of red sub-pixels, a plurality of green sub-pixels, and a plurality of blue sub-pixels. Nonetheless, in the disclosure, the number of scan units in the demultiplexer 220 is not limited to those shown in FIG. 2A. In some embodiments, the demultiplexer 220 may include at least one scan unit, but the disclosure is not limited thereto.

In this embodiment, the scan unit 221 includes a switch circuit 2211, a buffer 2212, and a pull-down transistor 2213. The switch circuit 2211 may be a transmission gate (TG) circuit, and is configured to control the buffer 2212. An input terminal of the switch circuit 2211 is configured to receive a control signal XCKH1. An input terminal of the buffer 2212 is electrically connected to the switch circuit 2211, and an output terminal of the buffer 2212 is electrically connected to the scan line G1. The buffer 2212 may be electrically connected to a high operating voltage VH and a low operating voltage VL to work between the high operating voltage VH and the low operating voltage VL. In this embodiment, a control terminal of the pull-down transistor 2213 is electrically connected to an output terminal of the inverter 224. A first terminal of the pull-down transistor 2213 is electrically connected to the output terminal of the buffer 2212. A second terminal of the pull-down transistor 2213 is electrically connected to a global control signal GAS, and the global control signal GAS may be configured to provide a low potential (pull-down voltage). In this embodiment, the output terminal of the inverter 224 is electrically connected to an input terminal of the inverter 225. An output terminal of the inverter 225 is electrically connected to a first control terminal (positive phase control terminal) of the switch circuit 2211 (transmission gate). The output terminal of the inverter 224 is electrically connected to a second control terminal (negative phase control terminal) of the switch circuit 2211 (transmission gate).

In this embodiment, the scan unit 222 includes a switch circuit 2221, a buffer 2222, and a pull-down transistor 2223, and the scan unit 223 includes a switch circuit 2231, a buffer 2232, and a pull-down transistor 2233. The pull-down transistors 2213, 2223, 2233 are N-type transistors. The switch circuits 2221, 2231 are transmission gate circuits and are configured to control the buffers 2222, 2232. In this embodiment, an input terminal of the switch circuit 2221 is configured to receive a control signal XCKH2, and an input terminal of the switch circuit 2231 is configured to receive a control signal XCKH3. An input terminal of the buffer 2222 is electrically connected to the switch circuit 2221, and an output terminal of the buffer 2222 is electrically connected to the scan line G2. An input terminal of the buffer 2232 is electrically connected to the switch circuit 2231, and an output terminal of the buffer 2232 is electrically connected to the scan line G3. The relevant circuit connection relationships of the scan units 222, 223 may be deduced by analogy from the relevant circuit connection relationships of the scan unit 221, so description thereof will not be further repeated. In addition, the control signals XCKH1 to XCKH3 and the global control signal GAS of this embodiment may be provided by other timing circuits or control circuits in the scan driving circuit 120, which is not limited by the disclosure.

FIG. 2B is a schematic diagram of signal waveforms according to some embodiments of the disclosure. With reference to FIG. 2A and FIG. 2B, the relevant signal waveforms of the circuits in FIG. 2A may be as shown in FIG. 2B. In this embodiment, the shift register 210 may output an output signal Sout, and the output signal Sout is at a high electric potential during time t0 to time t3. In this regard, the output signal Sout is input to second control terminals of the switch circuits 2211, 2221, 2231 and first control terminals of the switch circuits 2211, 2221, 2231 respectively through the inverters 224 and 225, so that the switch circuits 2211, 2221, 2231 are in a conducting state during time t0 to time t3. Therefore, during time t0 to time t3, the switch circuits 2211, 2221, 2231 output the control signals XCKH1 to XCKH3 to the buffers 2212, 2222, 2232 to be inverted by the buffers 2212, 2222, 2232. After that, the buffers 2212, 2222, 2232 output scan signals Sg1 to Sg3 to the scan lines G1 to G3. As shown in FIG. 2B, the control signals XCKH1 to XCKH3 received at the input terminals of the buffers 2212, 2222, 2232 through the switch circuits 2211, 2221, 2231 and the scan signals Sg1 to Sg3 received at the output terminals of the buffers 2212, 2222, and 2232 are inverted to each other, respectively. The scan signals Sg1 to Sg3 are respectively at a high electric potential during different periods to time-divisionally charge the scan lines G1 to G3. In addition, the one or more sub-pixels electrically connected to respectively the scan lines G1 to G3 may receive a data signal Sd provided by the data driving circuit through the plurality of data lines respectively during time t0 to time t3 in cooperation with the charging periods of the scan signals Sg1 to Sg3. Moreover, the pull-down transistors 2213, 2223, 2233 may correspondingly pull down the potentials of the scan lines G1 to G3 to a low potential after time t3.

For example, the scan line G1 may be electrically connected to one or more red sub-pixels. From time t0 to time t1, the scan line G1 charges the one or more red sub-pixels according to the scan signal Sg1, and the data signal Sd provides a red data signal to the one or more red sub-pixels at the same time. The scan line G2 may be electrically connected to one or more green sub-pixels. From time t1 to time t2, the scan line G2 charges the one or more green sub-pixels according to the scan signal Sg2, and the data signal Sd provides a green data signal to the one or more green sub-pixels at the same time. The scan line G3 may be electrically connected to one or more blue sub-pixels. From time t2 to time t3, the scan line G3 charges the one or more blue sub-pixels according to the scan signal Sg3, and the data signal Sd provides a blue data signal to the one or more blue sub-pixels at the same time.

Therefore, since the control signals XCKH1 to XCKH3 can increase the signal impelling power of the scan lines G1 to G3 through the buffers 2212, 2222, 2232, when the electronic device or panel is operated in a high-frequency driving mode, even if the charging time of the pixels is reduced, the scan units 221 to 223 of this embodiment can still sufficiently charge the scan lines G1 to G3. In addition, the rising time of the signal waveforms of the scan signals transmitted by the scan lines G1 to G3 can be effectively reduced, thus helping to sufficiently charge the scan lines G1 to G3. In other words, the electronic device or panel designed with the demultiplexer 220 of this embodiment can provide good image display quality in a high-frequency driving mode. Moreover, reception of other control signals is not required for the scan units 221 to 223 of this embodiment to pull down the potentials of the scan lines G1 to G3, and the circuit configuration space can be effectively reduced.

Figure 3:
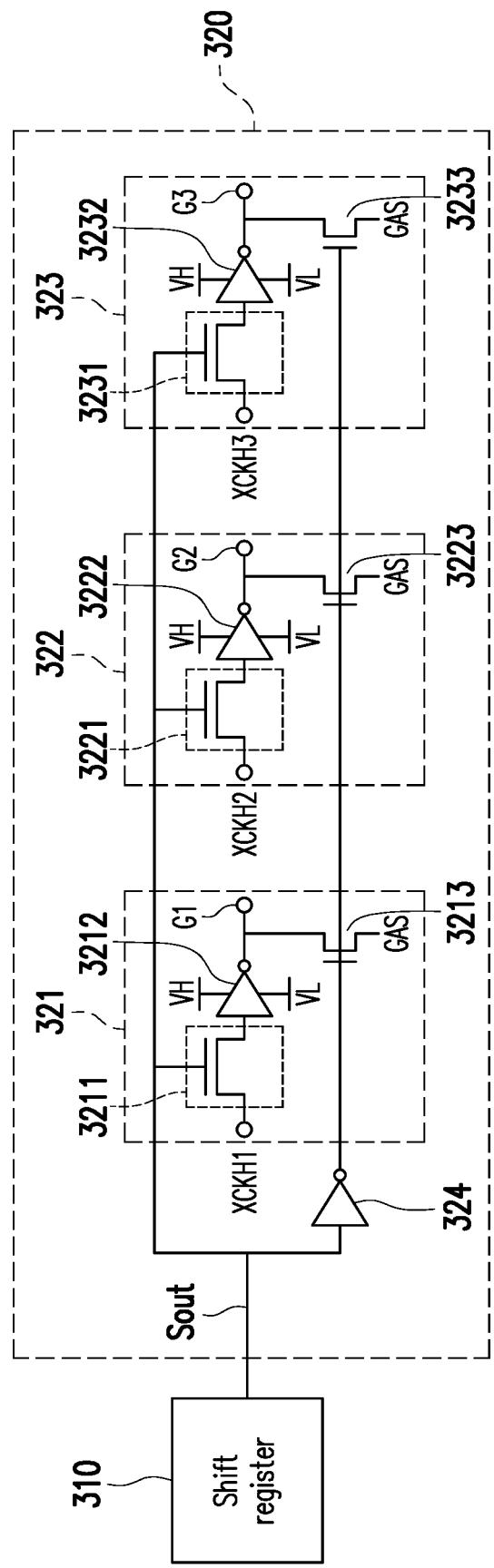
FIG. 3 is a schematic diagram of a scan driving circuit according to some embodiments of the disclosure.

FIG. 3 is a schematic diagram of a scan driving circuit according to some embodiments of the disclosure. With reference to FIG. 1 and FIG. 3, the scan driving circuit 120 in the embodiment of FIG. 1 may include one or more switching circuits, and the one or more switching circuits may be configured to drive the plurality of pixels in the pixel array 110. In this embodiment, each of the one or more switching circuits may include a shift register 310 and a demultiplexer 320 as shown in FIG. 3. In this embodiment, the demultiplexer 320 is electrically connected to the shift register 310. The demultiplexer 320 includes scan units 321 to 323 and an inverter 324. The scan units 321 to 323 are electrically connected to respectively the scan lines G1 to G3 of the pixel array 110. The scan lines G1 to G3 may respectively correspond to three sub-pixel rows, and the three sub-pixel rows respectively include, for example, a plurality of red sub-pixels, a plurality of green sub-pixels, and a plurality of blue sub-pixels. Nonetheless, in the disclosure, the number of scan units in the demultiplexer is not limited to those shown in FIG. 3. In some embodiments, the demultiplexer 320 may include at least one scan unit, but the disclosure is not limited thereto.

In this embodiment, the scan unit 321 includes a switch circuit 3211, a buffer 3212, and a pull-down transistor 3213. The switch circuit 3211 is an N-type transistor, and is configured to control the buffer 3212. An input terminal of the switch circuit 3211 is configured to receive the control signal XCKH1. An input terminal of the buffer 3212 is electrically connected to the switch circuit 3211, and an output terminal of the buffer 3212 is electrically connected to the scan line G1. The buffer 3212 may be electrically connected to the high operating voltage VH and the low operating voltage VL to work between the high operating voltage VH and the low operating voltage VL. In this embodiment, a control terminal of the pull-down transistor 3213 is electrically connected to an output terminal of the inverter 324. A first terminal of the pull-down transistor 3213 is electrically connected to the output terminal of the buffer 3212. A second terminal of the pull-down transistor 3213 is electrically connected to the global control signal GAS, and the global control signal GAS may be configured to provide a low potential (pull-down voltage). In this embodiment, the shift register 310 is electrically connected to an input terminal of the inverter 324 and a control terminal of the switch circuit 3211.

In this embodiment, the scan unit 322 includes a switch circuit 3221, a buffer 3222, and a pull-down transistor 3223, and the scan unit 323 includes a switch circuit 3231, a buffer 3232, and a pull-down transistor 3233. The switch circuits 3221, 3231 may be N-type transistors, and may be configured to control the buffers 3222, 3232. In this embodiment, an input terminal of the switch circuit 3221 is configured to receive the control signal XCKH2, and an input terminal of the switch circuit 3231 is configured to receive the control signal XCKH3. An input terminal of the buffer 3222 is electrically connected to the switch circuit 3221, and an output terminal of the buffer 3222 is electrically connected to the scan line G2. An input terminal of the buffer 3232 is electrically connected to the switch circuit 3231, and an output terminal of the buffer 3232 is electrically connected to the scan line G3. The relevant circuit connection relationships of the scan units 322 and 323 may be deduced by analogy from the relevant circuit connection relationships of the scan unit 321, so description thereof will not be further repeated. In addition, the control signals XCKH1 to XCKH3 and the global control signal GAS of this embodiment may be provided by other timing circuits or control circuits in the scan driving circuit 120, which is not limited by the disclosure. The pull-down transistors 3213, 3223, 3233 of this embodiment may be N-type transistors, but the disclosure is not limited thereto.

With reference to FIG. 2B and FIG. 3, the relevant signal waveforms of the circuits in FIG. 3 may also be as shown in FIG. 2B. In this embodiment, the shift register 310 may output the output signal Sout, and the output signal Sout is at a high electric potential during time t0 to time t3. In this regard, the output signal Sout is input to control terminals of the switch circuits 3211, 3221, 3231, so that the switch circuits 3211, 3221, 3231 are in a conducting state during time t0 to time t3. Therefore, during time t0 to time t3, the switch circuits 3211, 3221, 3231 output the control signals XCKH1 to XCKH3 to the buffers 3212, 3222, 3232 to be inverted by the buffers 3212, 3222, 3232. After that, the buffers 3212, 3222, 3232 output the scan signals Sg1 to Sg3 to the scan lines G1 to G3. As shown in FIG. 2B, the scan signals Sg1 to Sg3 are respectively at a high electric potential during different periods to time-divisionally charge the scan lines G1 to G3. In addition, the one or more sub-pixels electrically connected to respectively the scan lines G1 to G3 may receive the data signal Sd provided by the data driving circuit through the plurality of data lines respectively during time t0 to time t3 in cooperation with the charging periods of the scan signals Sg1 to Sg3. Moreover, the pull-down transistors 3213, 3223, 3233 may correspondingly pull down the potentials of the scan lines G1 to G3 to a low potential after time t3.

Therefore, since the control signals XCKH1 to XCKH3 can increase the signal impelling power of the scan lines G1 to G3 through the buffers 3212, 3222, 3232, when the electronic device or panel is operated in a high-frequency driving mode, even if the charging time of the pixels is reduced, the scan units 321 to 323 of this embodiment can still sufficiently charge the scan lines G1 to G3. In addition, the rising time of the signal waveforms of the scan signals transmitted by the scan lines G1 to G3 can be effectively reduced, thus helping to sufficiently charge the scan lines G1 to G3. In other words, the electronic device or panel designed with the demultiplexer 320 of this embodiment can provide good image display quality in a high-frequency driving mode. Moreover, reception of other control signals is not required for the scan units 321 to 323 of this embodiment to pull down the potentials of the scan lines G1 to G3, and the circuit configuration space can be effectively reduced.

Figure 4:
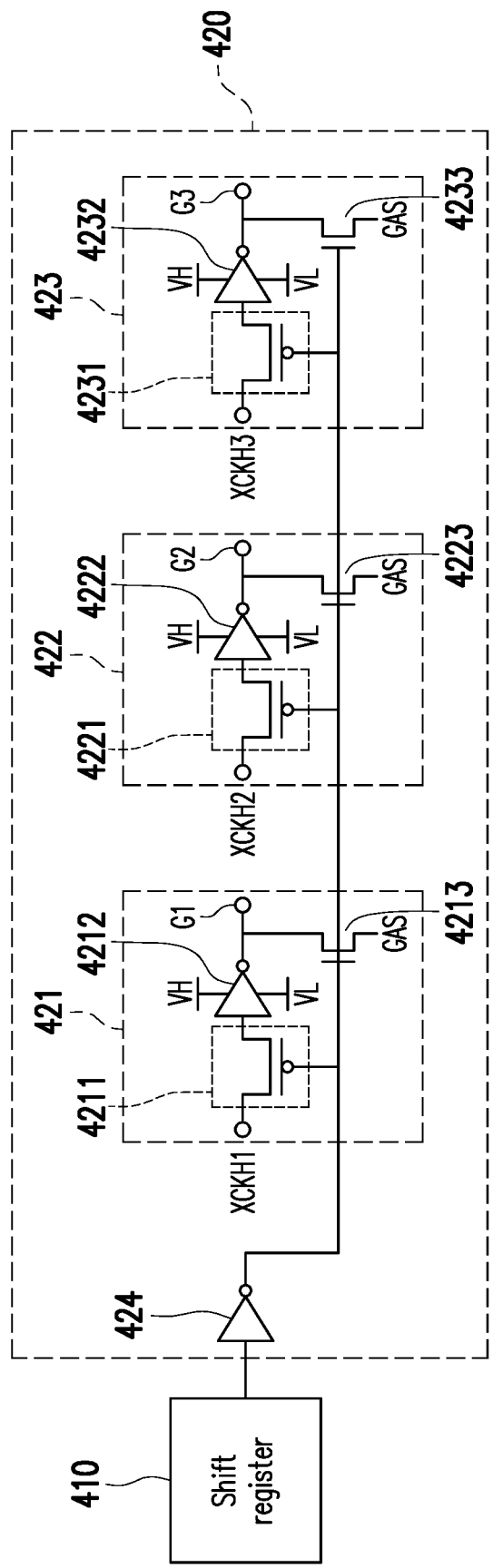
FIG. 4 is a schematic diagram of a scan driving circuit according to some embodiments of the disclosure.

FIG. 4 is a schematic diagram of a scan driving circuit according to some embodiments of the disclosure. With reference to FIG. 1 and FIG. 4, the scan driving circuit 120 in the embodiment of FIG. 1 may include one or more switching circuits, and the one or more switching circuits may be configured to drive the plurality of pixels in the pixel array 110. In this embodiment, each of the one or more switching circuits may include a shift register 410 and a demultiplexer 420 as shown in FIG. 4. In this embodiment, the demultiplexer 420 is electrically connected to the shift register 410. The demultiplexer 420 includes scan units 421 to 423 and an inverter 424. The scan units 421 to 423 are electrically connected to respectively the scan lines G1 to G3 of the pixel array 110. The scan lines G1 to G3 may, for example, correspond to three sub-pixel rows in a row of pixels, and the three sub-pixel rows respectively include, for example, a plurality of red sub-pixels, a plurality of green sub-pixels, and a plurality of blue sub-pixels. Nonetheless, in the disclosure, the number of scan units in the demultiplexer is not limited to those shown in FIG. 4. In some embodiments, the demultiplexer 420 may include at least one scan unit, but the disclosure is not limited thereto.

In this embodiment, the scan unit 421 includes a switch circuit 4211, a buffer 4212, and a pull-down transistor 4213. The switch circuit 4211 may be a P-type transistor, and may be configured to control the buffer 4212. An input terminal of the switch circuit 4211 is configured to receive the control signal XCKH1. An input terminal of the buffer 4212 is electrically connected to the switch circuit 4211, and an output terminal of the buffer 4212 is electrically connected to the scan line G1. The buffer 4212 may be electrically connected to the high operating voltage VH and the low operating voltage VL to work between the high operating voltage VH and the low operating voltage VL. In this embodiment, a control terminal of the pull-down transistor 4213 is electrically connected to an output terminal of the inverter 424. A first terminal of the pull-down transistor 4213 is electrically connected to the output terminal of the buffer 4212. A second terminal of the pull-down transistor 4213 is electrically connected to the global control signal GAS, and the global control signal GAS may be configured to provide a low potential (pull-down voltage). In this embodiment, the shift register 410 is electrically connected to an input terminal of the inverter 424.

In this embodiment, the scan unit 422 includes a switch circuit 4221, a buffer 4222, and a pull-down transistor 4223, and the scan unit 423 includes a switch circuit 4231, a buffer 4232, and a pull-down transistor 4233. The switch circuits 4221, 4231 may be P-type transistors, and may be configured to control the buffers 4222, 4232. In this embodiment, an input terminal of the switch circuit 4221 is configured to receive the control signal XCKH2, and an input terminal of the switch circuit 4231 is configured to receive the control signal XCKH3. An input terminal of the buffer 4222 is electrically connected to the switch circuit 4221, and an output terminal of the buffer 4222 is electrically connected to the scan line G2. An input terminal of the buffer 4232 is electrically connected to the switch circuit 4231, and an output terminal of the buffer 4232 is electrically connected to the scan line G3. The relevant circuit connection relationships of the scan units 422 and 423 may be deduced by analogy from the relevant circuit connection relationships of the scan unit 421, so description thereof will not be further repeated. Moreover, the control signals XCKH1 to XCKH3 and the global control signal GAS of this embodiment may be provided by other timing circuits or control circuits in the scan driving circuit 120, which is not limited by the disclosure. The pull-down transistors 4213, 4223, 4233 of this embodiment may be N-type transistors, but the disclosure is not limited thereto.

With reference to FIG. 2B and FIG. 4, the relevant signal waveforms of the circuit in FIG. 4 may also be as shown in FIG. 2B. In this embodiment, the shift register 410 may output the output signal Sout, and the output signal Sout is at a high electric potential during time t0 to time t3. In this regard, the output signal Sout is input to control terminals of the switch circuits 4211, 4221, 4231 through the inverter 424, so that the switch circuits 4211, 4221, 4231 are in a conducting state during time t0 to time t3. Therefore, during time t0 to time t3, the switch circuits 4211, 4221, 4231 output the control signals XCKH1 to XCKH3 to the buffers 4212, 4222, 4232 to be inverted by the buffers 4212, 4222, 4232. After that, the buffers 4212, 4222, 4232 output the scan signals Sg1 to Sg3 to the scan lines G1 to G3. As shown in FIG. 2B, the scan signals Sg1 to Sg3 are respectively at a high electric potential during different periods to time-divisionally charge the scan lines G1 to G3. In addition, the one or more sub-pixels electrically connected to respectively the scan lines G1 to G3 may receive the data signal Sd provided by the data driving circuit through the plurality of data lines respectively during time t0 to time t3 in cooperation with the charging periods of the scan signals Sg1 to Sg3. Moreover, the pull-down transistors 4213, 4223, 4233 may correspondingly pull down the potentials of the scan lines G1 to G3 to a low potential after time t3.

Therefore, since the control signals XCKH1 to XCKH3 can increase the signal impelling power of the scan lines G1 to G3 through the buffers 4212, 4222, 4232, when the electronic device or panel is operated in a high-frequency driving mode, even if the charging time of the pixels is reduced, the scan units 421 to 423 of this embodiment can still sufficiently charge the scan lines G1 to G3. In addition, the rising time of the signal waveforms of the scan signals transmitted by the scan lines G1 to G3 can be effectively reduced, thus helping to sufficiently charge the scan lines G1 to G3. In other words, the electronic device or panel designed with the demultiplexer 420 of this embodiment can provide good image display quality in a high-frequency driving mode. Moreover, reception of other control signals is not required for the scan units 421 to 423 of this embodiment to pull down the potentials of the scan lines G1 to G3, and the circuit configuration space can be effectively reduced.

Figure 5:
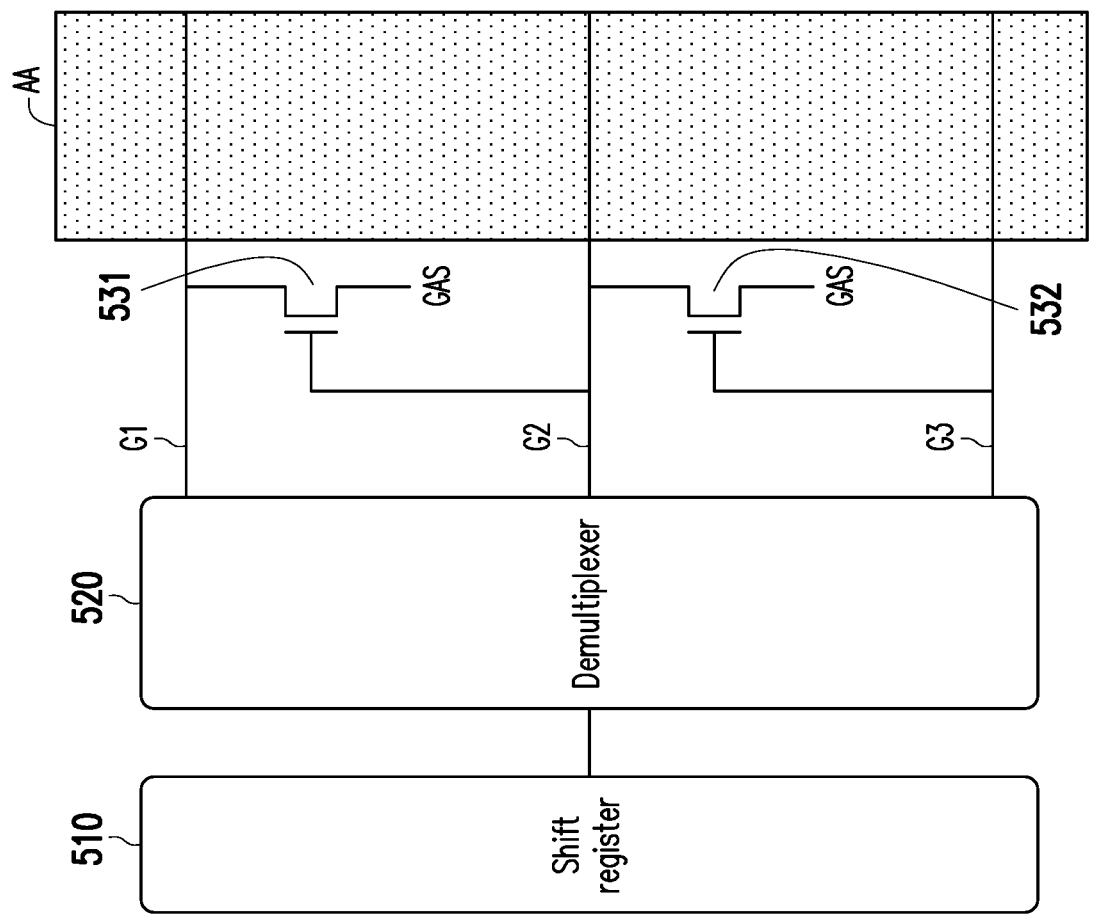
FIG. 5 is a diagram showing circuit configuration of an electronic device according to some embodiments of the disclosure.
Figure 8:
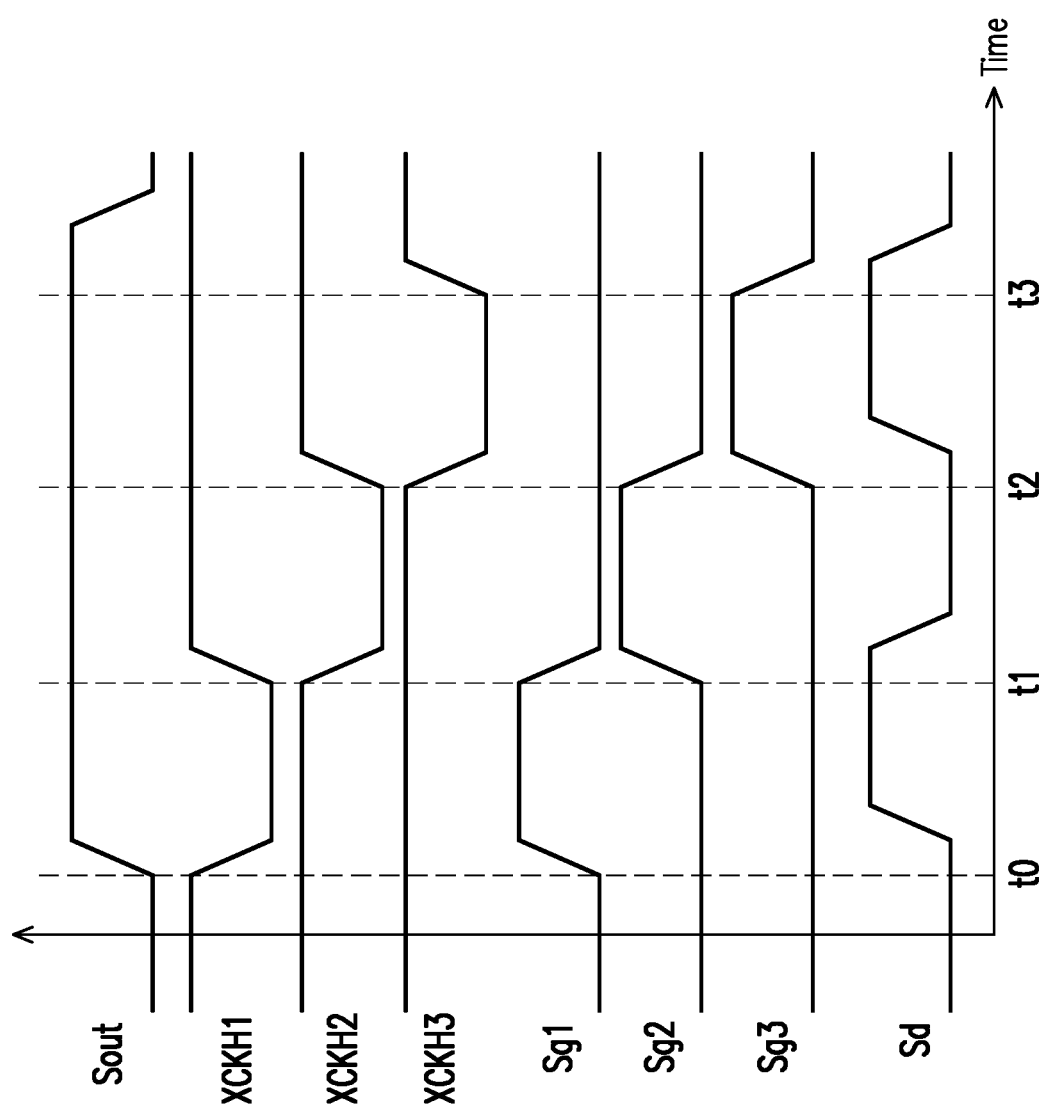
FIG. 8 is a schematic diagram of signal waveforms according to some embodiments of the disclosure.

FIG. 5 is a diagram showing circuit configuration of an electronic device according to some embodiments of the disclosure. FIG. 8 is a schematic diagram of signal waveforms according to some embodiments of the disclosure. With reference to FIG. 1, FIG. 5, and FIG. 8, the circuit configuration of the electronic device 100 may be as shown in FIG. 5. In this embodiment, a shift register 510 is electrically connected to a demultiplexer 520. The demultiplexer 520 is electrically connected to a pixel array (such as the pixel array 110 of FIG. 1) in the active area AA through the scan lines G1 to G3. In this embodiment, a control terminal of a pull-down transistor 531 is electrically connected to the scan line G2, and a first terminal of the pull-down transistor 531 is electrically connected to the scan line G1. A control terminal of a pull-down transistor 532 is electrically connected to the scan line G3, and a first terminal of the pull-down transistor 532 is electrically connected to the scan line G2. The pull-down transistors 531, 532 may be N-type transistors, but the disclosure is not limited thereto. In this embodiment, when the scan signals of the scan lines G1 to G3 is operated as shown in FIG. 8, during time t1, when the corresponding scan signal Sg1 starts to fall, the corresponding scan signal Sg2 starts to rise. Turning on the pull-down transistor 531 by the scan signal Sg2 can help the scan line G1 to pull down its potential. In this embodiment, during time t1, the corresponding scan signal Sg1 falls in the same instant when the corresponding scan signal Sg2 rises. During time t2, when the corresponding scan signal Sg2 starts to fall, the corresponding scan signal Sg3 starts to rise. Turning on the pull-down transistor 532 by the scan signal Sg3 can help the scan line G2 to pull down its potential. In this embodiment, during time t2, the corresponding scan signal Sg2 falls in the same instant when the corresponding scan signal Sg3 rises. Similarly, the potential of the scan line G3 may also be pulled down by another pull-down transistor (not shown) cooperated with other scan lines, which is not limited by the disclosure.

Moreover, the one or more sub-pixels electrically connected to respectively the scan lines G1 to G3 may receive the data signal Sd provided by the data driving circuit through the plurality of data lines respectively during time t0 to time t3 in cooperation with the charging periods of the scan signals Sg1 to Sg3.

Notably, the diagram of circuit configuration in this embodiment may be applied to the shift registers 210, 310, and 410 and the demultiplexers 220, 320, and 420 in the embodiments of FIG. 2A, FIG. 3, and FIG. 4. In this embodiment, the shift registers 210, 310, and 410 in the embodiments of FIG. 2A, FIG. 3, and FIG. 4 may be configured to output the output signal Sout shown in FIG. 8, and the demultiplexers 220, 320, and 420 may be configured to receive the control signals XCKH1 to XCKH3 shown in FIG. 8. In this embodiment, since the pull-down transistors 531, 532 are additionally disposed on one end of the scan lines G1 to G3 between the demultiplexer 520 and the active area AA, the falling time of the signal waveforms of the scan signals transmitted by the scan lines G1 to G3 of this embodiment can be effectively reduced, thus helping to sufficiently charge the scan lines G1 to G3.

Figure 6:
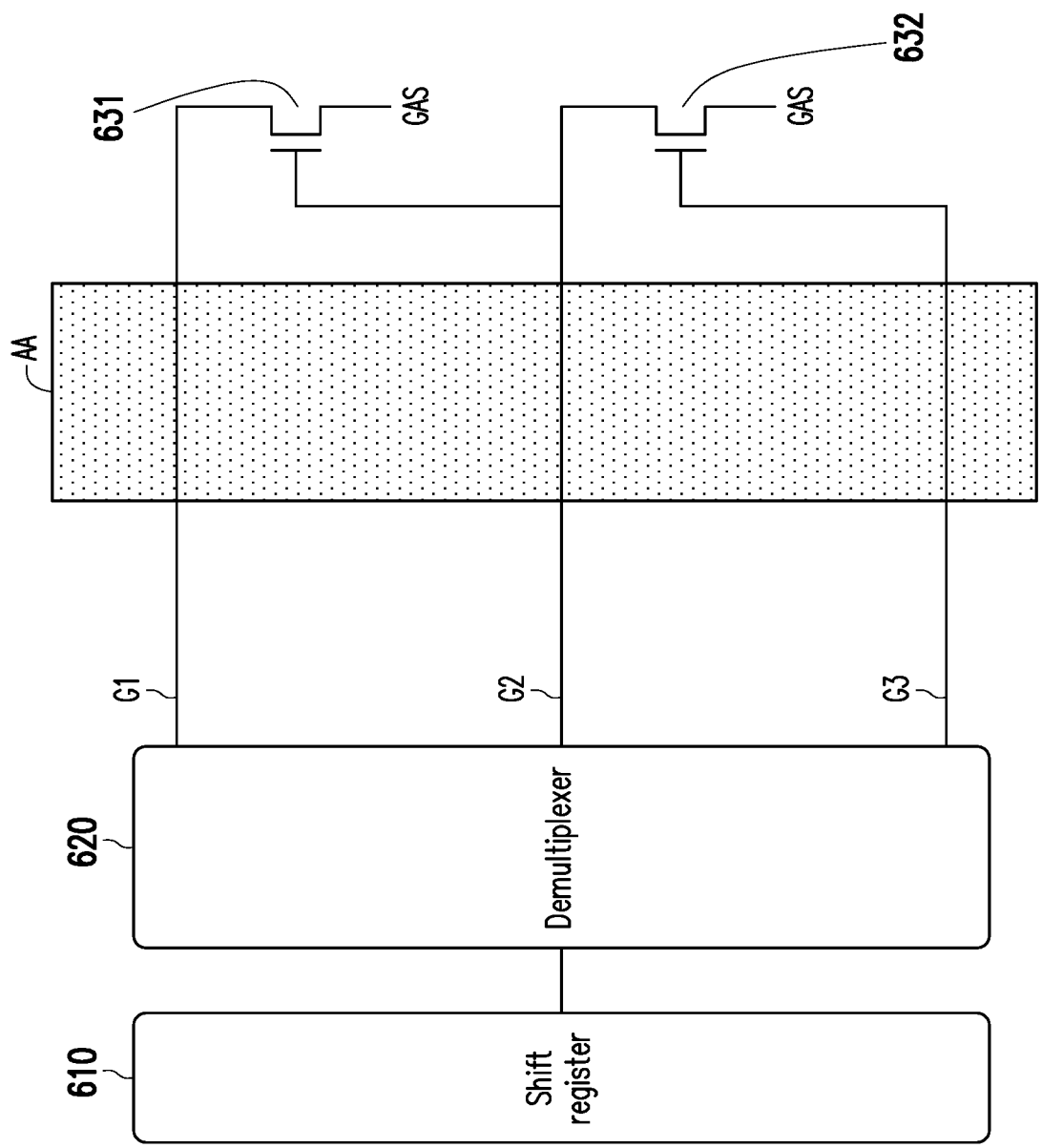
FIG. 6 is a diagram showing circuit configuration of an electronic device according to some embodiments of the disclosure.

FIG. 6 is a diagram showing circuit configuration of an electronic device according to some embodiments of the disclosure. With reference to FIG. 6, similar to FIG. 5, a shift register 610 of this embodiment is electrically connected to a demultiplexer 620. The demultiplexer 620 is electrically connected to a pixel array (such as the pixel array 110 in FIG. 1) in the active area AA through the scan lines G1 to G3. In this embodiment, a control terminal of a pull-down transistor 631 is electrically connected to the scan line G2, and a first terminal of the pull-down transistor 631 is electrically connected to the scan line G1. A control terminal of a pull-down transistor 632 is electrically connected to the scan line G3, and a first terminal of the pull-down transistor 632 is electrically connected to the scan line G2. The pull-down transistors 631, 632 may be N-type transistors, but the disclosure is not limited thereto.

Different from the circuit configuration in FIG. 5, in the electronic device of this embodiment, the pull-down transistors 631, 632 are additionally disposed on another end of the scan lines G1 to G3 located on the other side of the active area AA away from the demultiplexer 620. In this regard, the pulling-down of potentials by the pull-down transistors 631, 632 of this embodiment may be deduced by analogy from FIG. 5 and FIG. 8, so description thereof will not be further repeated. In this embodiment, since the pull-down transistors 631, 632 are additionally disposed on the another end of the scan lines G1 to G3 on the other side of the active area AA, the falling time of the signal waveforms of the scan signals of the scan lines G1 to G3 of this embodiment can be effectively reduced, thus helping to sufficiently charge the scan lines G1 to G3.

Figure 7:
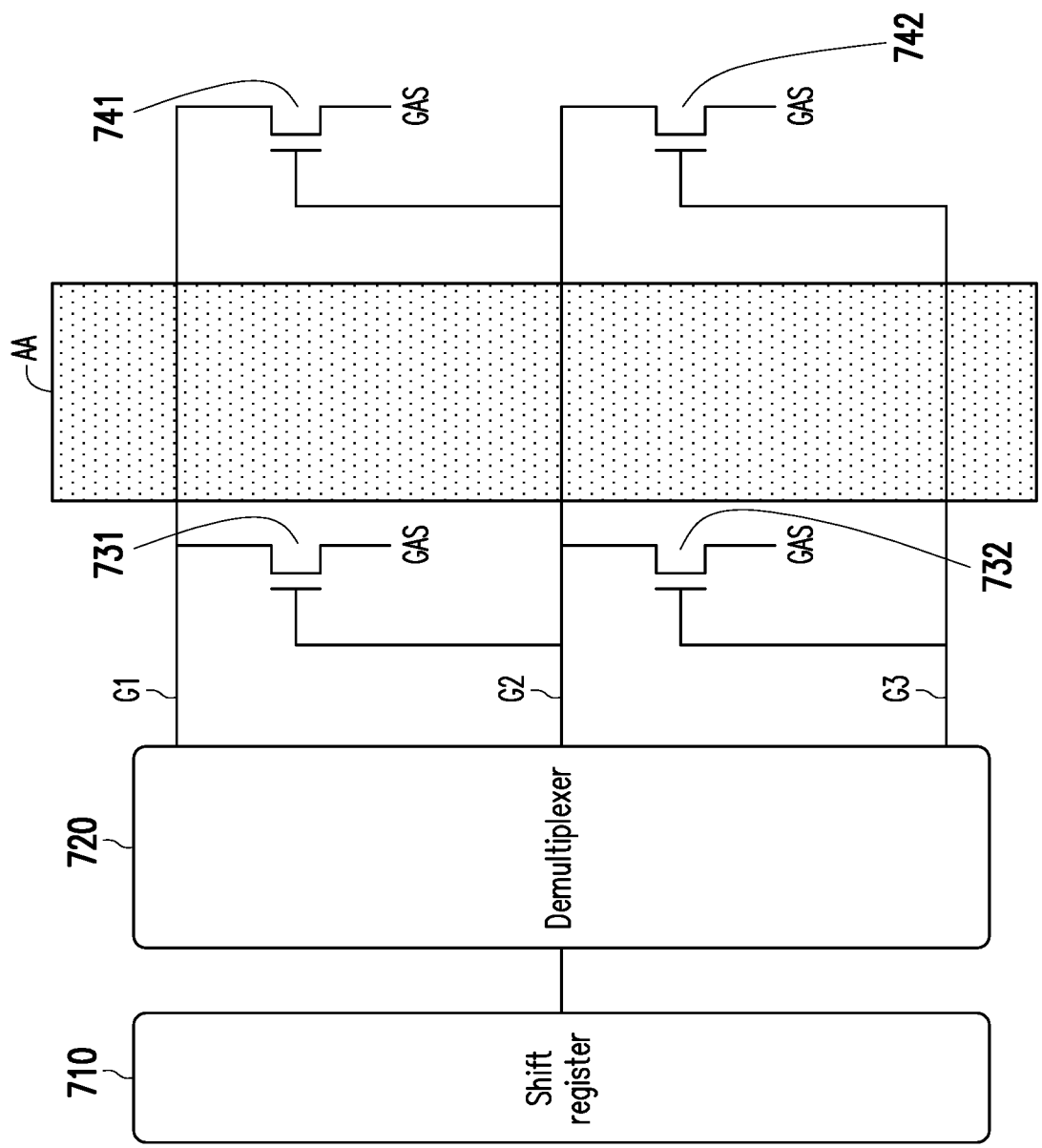
FIG. 7 is a diagram showing circuit configuration of an electronic device according to some embodiments of the disclosure.

FIG. 7 is a diagram showing circuit configuration of an electronic device according to some embodiments of the disclosure. With reference to FIG. 7, similar to FIG. 5 and FIG. 6, a shift register 710 of this embodiment is electrically connected to a demultiplexer 720. The demultiplexer 720 is electrically connected to a pixel array (such as the pixel array 110 in FIG. 1) in the active area AA through the scan lines G1 to G3. In this embodiment, a control terminal of a pull-down transistor 731 is electrically connected to the scan line G2, and a first terminal of the pull-down transistor 731 is electrically connected to the scan line G1. A control terminal of a pull-down transistor 732 is electrically connected to the scan line G3, and a first terminal of the pull-down transistor 732 is electrically connected to the scan line G2. The pull-down transistors 731, 732 may be N-type transistors, but the disclosure is not limited thereto. In this embodiment, a control terminal of a pull-down transistor 741 is electrically connected to the scan line G2, and a first terminal of the pull-down transistor 741 is electrically connected to the scan line G1. A control terminal of a pull-down transistor 742 is electrically connected to the scan line G3, and a first terminal of the pull-down transistor 742 is electrically connected to the scan line G2. The pull-down transistors 741, 742 are N-type transistors.

In the electronic device of this embodiment, the pull-down transistors 731, 732, 741, 742 are additionally disposed on respectively two ends of the scan lines G1 to G3 on one side and on the other side of the active area AA. In this regard, the pulling-down of potentials by the pull-down transistors 731, 732, 741, 742 of this embodiment may be deduced by the analogy from FIG. 5, FIG. 6, and FIG. 8, so description thereof will not be further repeated. In this embodiment, since the pull-down transistors 731, 732, 741, 742 are additionally disposed on the two ends of the scan lines G1 to G3 on both sides of the active area AA, the falling time of the signal waveforms of the scan signals of the scan lines G1 to G3 of this embodiment can be effectively reduced, thus helping to sufficiently charge the scan lines G1 to G3.

Moreover, when analyzing an electronic product or producing evidence therefor, for example, by observing through an optical microscope, if the data driving circuit of the electronic product includes circuit components or circuit configurations similar to those in the foregoing embodiments, or if signal waveform properties similar to those shown in FIG. 2B or FIG. 8 are obtained through signal measurement, the electronic product may be regarded as embodying the circuit design architecture of the electronic device or the scan driving circuit claimed in the disclosure.

In summary of the foregoing, in the electronic device and the scan driving circuit of the disclosure, the panel can effectively provide sufficient charge for the pixels in the pixel array of the driving panel, particularly when the panel is operated in a high-frequency drive mode. For example, at least one of the signal rising time and the signal falling time of the scan signal is reduced. Thereby, the panel can provide good image quality in a high-frequency drive mode. Alternatively, in the electronic device and the scan driving circuit of the disclosure, based on the special configuration of the pull-down transistor provided by the disclosure, the number of signal lines, the number of output control signals and the scan driving circuit can be effectively reduced.

Finally, it should be noted that the foregoing embodiments are used only to describe, but not limit, the technical solutions of the disclosure. Although the disclosure has been described in detail with reference to the foregoing embodiments, people having ordinary skill in the art should understand that the technical solutions described in the foregoing embodiments may still be modified, or that some or all technical features therein may be equivalently replaced. However, the nature of the corresponding technical solutions so modified or replaced does not depart from the scope of the technical solutions of the embodiments of the disclosure.

What is claimed is:

1. An electronic device, comprising:
   a shift register; and
   a demultiplexer, electrically connected to the shift register, and comprising at least one scan unit and a first inverter, wherein the at least one scan unit comprises:
   a switch circuit;
   a buffer, wherein an input terminal of the buffer is electrically connected to the switch circuit, and an output terminal of the buffer is electrically connected to a scan line; and
   a first pull-down transistor, wherein a control terminal of the first pull-down transistor is electrically connected to an output terminal of the first inverter, and a first terminal of the first pull-down transistor is electrically connected to the output terminal of the buffer,
   wherein an input terminal of the first inverter is electrically connected to the shift register, and the input terminal or the output terminal of the first inverter is electrically connected to the switch circuit.

2. The electronic device according to claim 1, wherein the switch circuit is a transmission gate circuit, and the electronic device further comprises a second inverter, wherein the output terminal of the first inverter is electrically connected to an input terminal of the second inverter, an output terminal of the second inverter is electrically connected to a first control terminal of the transmission gate circuit, and the output terminal of the first inverter is electrically connected to a second control terminal of the transmission gate circuit.

3. The electronic device according to claim 1, wherein the switch circuit is an N-type transistor, and a control terminal of the N-type transistor is electrically connected to the shift register and the input terminal of the first inverter.

4. The electronic device according to claim 1, wherein the switch circuit is a P-type transistor, and a control terminal of the P-type transistor is electrically connected to the shift register and the output terminal of the first inverter.

5. The electronic device according to claim 1, further comprising:
   a second pull-down transistor, wherein a control terminal of the second pull-down transistor is electrically connected to another scan line, and a first terminal of the second pull-down transistor is electrically connected to the scan line.

6. The electronic device according to claim 5, further comprising:
   a third pull-down transistor, wherein the control terminal of the third pull-down transistor is electrically connected to the another scan line, and the first terminal of the third pull-down transistor is electrically connected to the scan line, wherein the second pull-down transistor and the third pull-down transistor are respectively located on one end and another end of the scan line and the another scan line.

7. The electronic device according to claim 1, wherein a control signal received by the input terminal of the buffer through the switch circuit and a scan signal output by the output terminal of the buffer are inverted to each other.

8. The electronic device according to claim 1, wherein the demultiplexer comprises a plurality of scan units, and a plurality of scan signals output by the plurality of scan units are at a high electric potential respectively during different periods to time-divisionally charge a plurality of scan lines.

9. A scan driving circuit, comprising:
   a shift register; and
   a demultiplexer, electrically connected to the shift register, and comprising at least one scan unit and a first inverter, wherein the at least one scan unit comprises:
   a switch circuit;
   a buffer, wherein an input terminal of the buffer is electrically connected to the switch circuit, and an output terminal of the buffer is electrically connected to a scan line; and a first pull-down transistor, wherein a control terminal of the first pull-down transistor is electrically connected to an output terminal of the first inverter, and a first terminal of the first pull-down transistor is electrically connected to the output terminal of the buffer, wherein an input terminal of the first inverter is electrically connected to the shift register, and the input terminal or the output terminal of the first inverter is electrically connected to the switch circuit.

10. The scan driving circuit according to claim 9, wherein the switch circuit is a transmission gate circuit, and the scan driving circuit further comprises a second inverter, wherein the output terminal of the first inverter is electrically connected to an input terminal of the second inverter, an output terminal of the second inverter is electrically connected to a first control terminal of the transmission gate circuit, and the output terminal of the first inverter is electrically connected to a second control terminal of the transmission gate circuit.

11. The scan driving circuit according to claim 9, wherein the switch circuit is an N-type transistor, and a control terminal of the N-type transistor is electrically connected to the shift register and the input terminal of the first inverter.

12. The scan driving circuit according to claim 9, wherein the switch circuit is a P-type transistor, and a control terminal of the P-type transistor is electrically connected to the shift register and the output terminal of the first inverter.

13. The scan driving circuit according to claim 9, further comprising:
a second pull-down transistor, wherein a control terminal of the second pull-down transistor is electrically connected to another scan line, and a first terminal of the second pull-down transistor is electrically connected to the scan line.

14. The scan driving circuit according to claim 13, further comprising:
a third pull-down transistor, wherein the control terminal of the third pull-down transistor is electrically connected to the another scan line, and the first terminal of the third pull-down transistor is electrically connected to the scan line, wherein the second pull-down transistor and the third pull-down transistor are respectively located on one end and another end of the scan line and the another scan line.

15. The scan driving circuit according to claim 9, wherein a control signal received by the input terminal of the buffer through the switch circuit and a scan signal output by the output terminal of the buffer are inverted to each other.

16. The scan driving circuit according to claim 9, wherein the demultiplexer comprises a plurality of scan units, and a plurality of scan signals output by the plurality of scan units are at a high electric potential respectively during different periods to time-divisionally charge a plurality of scan lines.

* * * * *